(12) United States Patent
Chan et al.

(10) Patent No.: US 8,354,707 B2
(45) Date of Patent: Jan. 15, 2013

(54) ELECTRICALLY PROGRAMMABLE DEVICE WITH EMBEDDED EEPROM AND METHOD FOR MAKING THEREOF

(75) Inventors: Yi-Peng Chan, Shanghai (CN); Sheng-He Huang, Shanghai (CN); Zhen Yang, Shanghai (CN)

(73) Assignee: Semiconductor Manufacturing International (Shanghai) Corporation, Shanghai (CN)

( * ) Notice: Subject to any disclaimer, the term of this patent is extended or adjusted under 35 U.S.C. 154(b) by 369 days.

(21) Appl. No.: 12/833,939

(22) Filed: Jul. 9, 2010

(65) Prior Publication Data
US 2010/0276745 A1    Nov. 4, 2010

Related U.S. Application Data

(62) Division of application No. 12/180,389, filed on Jul. 25, 2008, now Pat. No. 7,759,194.

(51) Int. Cl.
*H01L 27/115* (2006.01)
(52) U.S. Cl. ............... 257/321; 257/324; 257/E27.103; 257/E29.304; 257/266; 257/299
(58) Field of Classification Search .............. 257/321, 257/324, E27.103, E29.304, 266, 299, 595
See application file for complete search history.

(56) References Cited

U.S. PATENT DOCUMENTS

| 6,937,161 B2 * | 8/2005 | Nishimura .................... 340/917 |
| 6,967,161 B2 | 11/2005 | Fumitake |
| 7,517,756 B2 * | 4/2009 | Yuan ............................. 438/257 |
| 7,759,194 B2 | 7/2010 | Chan et al. |

FOREIGN PATENT DOCUMENTS

CN    200710042341.5    6/2007

OTHER PUBLICATIONS

Notice of Allowance for U.S. Appl. No. 12/180,389, mailed on Mar. 10, 2010, 9 pages.

* cited by examiner

*Primary Examiner* — Marc Armand
(74) *Attorney, Agent, or Firm* — Kilpatrick Townsend & Stockton LLP

(57) ABSTRACT

A semiconductor device includes a substrate and a first gate oxide layer overlying a first device region and a second device region in the substrate, a first gate in the first device region, and a second gate and a third gate in the second device region. The device also has a first dielectric layer with a first portion disposed on the first gate, a second portion disposed adjacent a sidewall of the first gate, and a third portion disposed over the third gate. An inter-gate oxide layer is disposed on the first gate and between the first portion and the second portion of the first dielectric layer. A fourth gate overlies the second gate oxide layer, the inter-gate oxide layer, and the first portion and the second portion of the first dielectric layer in the first device region. A fifth gate overlies the third portion of the first dielectric layer which is disposed over the third gate in the second device region.

17 Claims, 14 Drawing Sheets

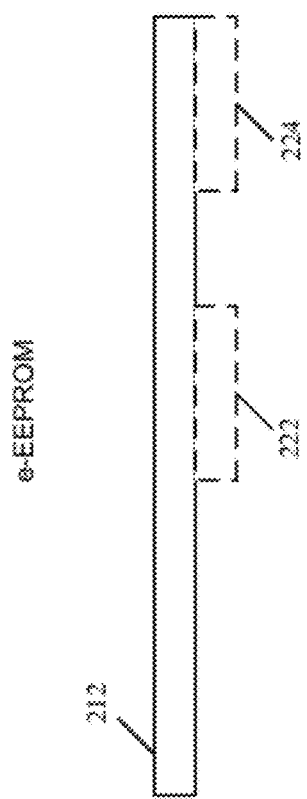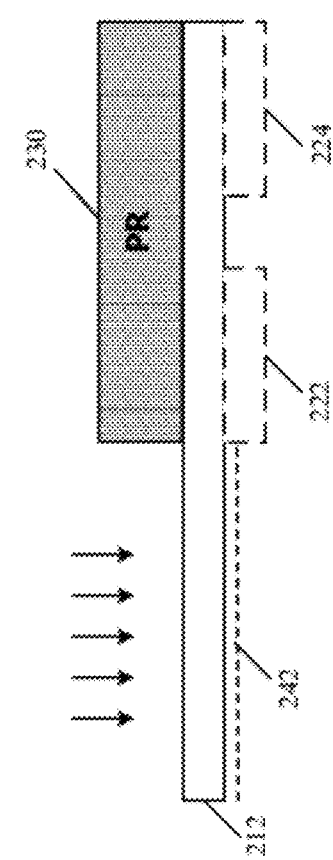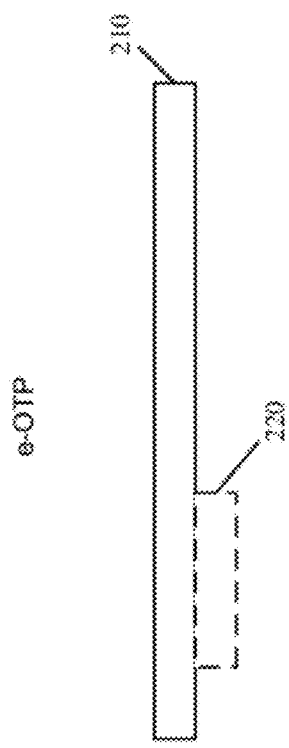
FIG. 2
FIG. 3

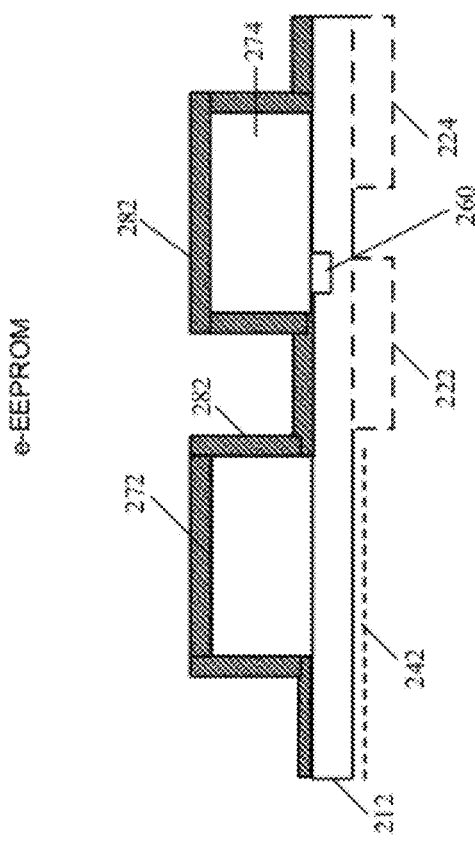
FIG. 8
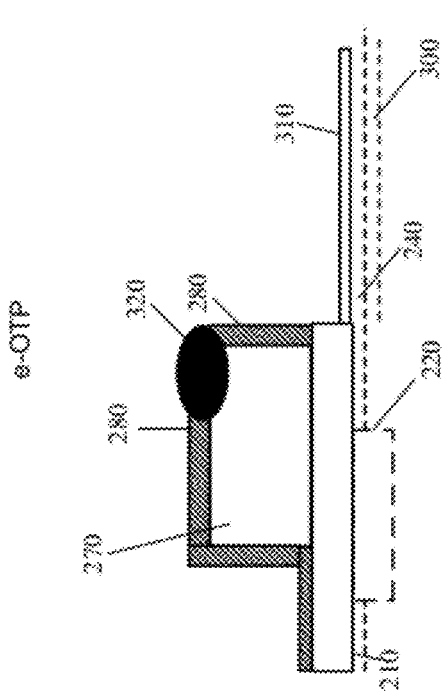
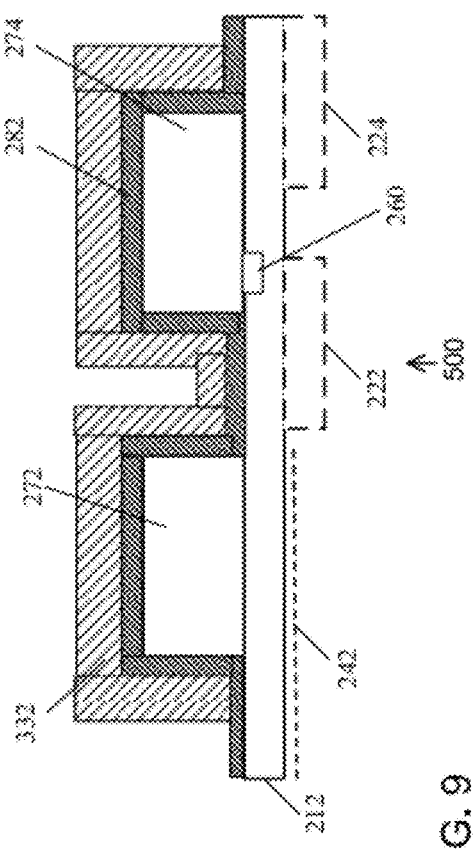
FIG. 9
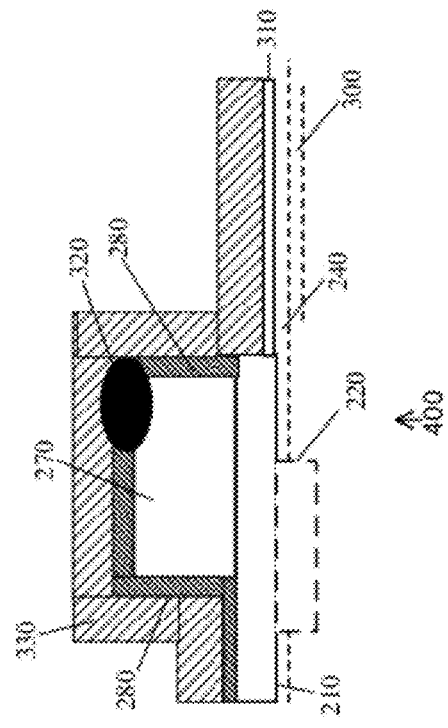

ELECTRICALLY PROGRAMMABLE DEVICE WITH EMBEDDED EEPROM AND METHOD FOR MAKING THEREOF

CROSS-REFERENCES TO RELATED APPLICATIONS

This application is a Divisional of U.S. patent application Ser. No. 12/180,389, filed Jul. 25, 2008, which claims priority to Chinese Patent Application No. 200710042341.5, filed on Jun. 21, 2007, both of which are commonly assigned and are hereby incorporated by reference in their entirety for all purposes.

BACKGROUND OF THE INVENTION

The present invention is directed to integrated circuits and their processing for the manufacture of semiconductor devices. More particularly, the invention provides a programmable device with embedded electrically-erasable programmable read-only memory (EEPROM) and method for making thereof. Merely by way of example, the invention has been applied to one-time programmable (OTP) device with embedded EEPROM. But it would be recognized that the invention has a much broader range of applicability.

Integrated circuits or "ICs" have evolved from a handful of interconnected devices fabricated on a single chip of silicon to millions of devices. Current ICs provide performance and complexity far beyond what was originally imagined. In order to achieve improvements in complexity and circuit density (i.e., the number of devices capable of being packed onto a given chip area), the size of the smallest device feature, also known as the device "geometry", has become smaller with each generation of ICs. Semiconductor devices are now being fabricated with features less than a quarter of a micron across.

Increasing circuit density has not only improved the complexity and performance of ICs but has also provided lower cost parts to the consumer. An IC fabrication facility can cost hundreds of millions, or even billions, of dollars. Each fabrication facility will have a certain throughput of wafers, and each wafer will have a certain number of ICs on it. Therefore, by making the individual devices of an IC smaller, more devices may be fabricated on each wafer, thus increasing the output of the fabrication facility. Moreover, the output of the fabrication facility also depends on the complexity of the fabrication process. For example, additional masking steps and/or additional ion implantation steps may significantly reduce the throughput and increase the cost.

Fabrication of custom integrated circuits using chip foundry services has evolved over the years. Fabless chip companies often design the custom integrated circuits. Such custom integrated circuits require a set of custom masks commonly called "reticles" to be manufactured. A chip foundry company called Semiconductor International Manufacturing Company (SMIC) of Shanghai, China is an example of a chip company that performs foundry services. Although fabless chip companies and foundry services have increased through the years, many limitations still exist. For example, it is difficult to efficiently make erasable programmable read-only memory (EPROM) with embedded EEPROM. These and other limitations are described throughout the present specification and more particularly below.

From the above, it is seen that an improved semiconductor device and method for making thereof is desired.

BRIEF SUMMARY OF THE INVENTION

The present invention is directed to integrated circuits and their processing for the manufacture of semiconductor devices. More particularly, the invention provides a programmable device with embedded electrically-erasable programmable read-only memory (EEPROM) and method for making thereof. Merely by way of example, the invention has been applied to one-time programmable (OTP) device with embedded EEPROM. But it would be recognized that the invention has a much broader range of applicability.

In a specific embodiment, the invention provides a method for making a semiconductor device. The method includes providing a substrate including a first device region and a second device region, growing a first gate oxide layer in the first device region and the second device region, and forming a first diffusion region in the first device region and a second diffusion region and a third diffusion region in the second device region. Additionally, the method includes implanting a first plurality of ions to form a fourth diffusion region in the first device region and a fifth diffusion region in the second device region. The fourth diffusion region overlaps with the first diffusion region. Moreover, the method includes forming a first gate in the first device region and a second gate and a third gate in the second device region, and depositing a first dielectric layer on the first gate, the second gate, the third gate, and the first gate oxide layer. Also, the method includes etching a first part and a second part of the first dielectric layer and a first part of the first gate oxide layer in the first device region. The first part of the first dielectric layer is on the first gate, and the second part of the first dielectric layer is on the first part of the first gate oxide layer. Additionally, the method includes growing an inter-gate oxide layer and a second gate oxide layer in the first device region. The inter-gate oxide layer is on the first gate, and the second gate oxide layer is on the substrate. Moreover, the method includes forming a fourth gate on at least the second oxide layer, the inter-gate oxide layer, and the first dielectric layer in the first device region, forming a fifth gate on the first dielectric layer in the second device region, and implanting a second plurality of ions to form a plurality of source regions and a plurality of drain regions. The etching a first part and a second part of the first dielectric layer and a first part of the first gate oxide layer in the first device region is free from removing any part of the first dielectric layer in the second device region.

According to another embodiment, a method for making a semiconductor device includes providing a substrate including a first device region and a second device region, growing a first gate oxide layer in the first device region and the second device region, and forming a first diffusion region in the first device region and a second diffusion region and a third diffusion region in the second device region. Additionally, the method includes implanting a first plurality of ions to form a fourth diffusion region in the first device region and a fifth diffusion region in the second device region. The fourth diffusion region overlaps with the first diffusion region. Moreover, the method includes forming a first gate in the first device region and a second gate and a third gate in the second device region, and depositing a first dielectric layer on the first gate, the second gate, the third gate, and the first gate oxide layer. Also, the method includes etching a first part and a second part of the first dielectric layer and a first part of the first gate oxide layer in the first device region. The first part of the first dielectric layer is on the first gate, and the second part of the first dielectric layer is on the first part of the first gate oxide layer. Additionally, the method includes growing an inter-gate oxide layer and a second gate oxide layer in the first device region, the inter-gate oxide layer being on the first gate, the second gate oxide layer being on the substrate, and forming a fourth gate on at least the second oxide layer, the inter-gate oxide layer, and the first dielectric layer in the first device region. Moreover, the method includes forming a fifth gate on the first dielectric layer in the second device region, and implanting a second plurality of ions to form a plurality of source regions and a plurality of drain regions. The inter-gate oxide layer is associated with a thickness ranging from 150 Å to 250 Å, and the forming a fourth gate includes using the first dielectric layer as an etch stopping layer.

According to yet another embodiment, a semiconductor device with embedded EEPROM devices includes a one-time programmable device on a silicon wafer and an electrically erasable programmable device on the silicon wafer. The one-time programmable device includes a first gate oxide layer and a second gate oxide layer. The second gate oxide layer is thinner than the first gate oxide layer. Additionally, the one-time programmable device includes a first gate on the first gate oxide layer, a first dielectric layer on the first gate, an inter-gate oxide layer on the first gate, and a second gate on the first dielectric layer, the inter-gate oxide layer, and the second gate oxide layer. The inter-gate oxide is adapted to shape the first gate for programming the one-time programmable device. Moreover, the electrically erasable programmable device has a tunnel oxide for programming and erasing in the electrically erasable programmable device.

Many benefits are achieved by way of the present invention over conventional techniques. For example, the present technique provides a process for making programmable devices which is fully compatible with a process for making EEPROM devices. In some embodiments, the method provides an easy to use process that relies upon conventional technology. Additionally, the method often does not require any substantial modifications to conventional equipment and processes. Depending upon the embodiment, one or more of these benefits may be achieved. These and other benefits will be described in more throughout the present specification and more particularly below.

Various additional objects, features and advantages of the present invention can be more fully appreciated with reference to the detailed description and accompanying drawings that follow.

BRIEF DESCRIPTION OF THE DRAWINGS

FIG. 2 is a simplified process for ion implantation and gate oxide formation according to an embodiment of the present invention;

FIG. 3 is a simplified process for photolithography and ion implantation according to an embodiment of the present invention;

FIG. 8 is a simplified process for growing gate and inter-gate oxide according to an embodiment of the present invention;

FIG. 9 is a simplified process for polysilicon deposition according to an embodiment of the present invention;

DETAILED DESCRIPTION OF THE INVENTION

The present invention is directed to integrated circuits and their processing for the manufacture of semiconductor devices. More particularly, the invention provides a programmable device with embedded electrically-erasable programmable read-only memory (EEPROM) and method for making thereof Merely by way of example, the invention has been applied to one-time programmable (OTP) device with embedded EEPROM. But it would be recognized that the invention has a much broader range of applicability.

Figure 1:
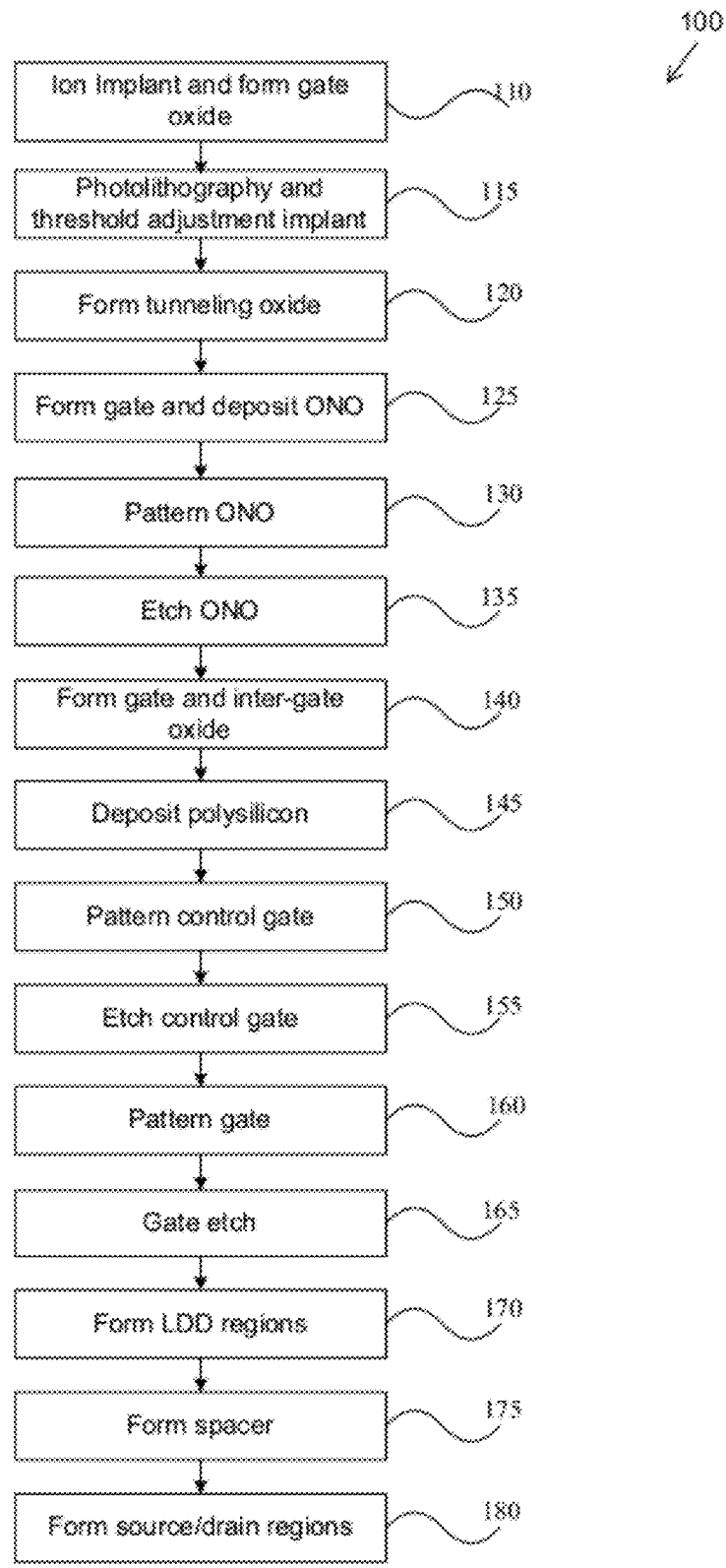
FIG. 1 is a simplified method for forming a programmable device according to an embodiment of the present invention.

FIG. 1 is a simplified method for forming a programmable device according to an embodiment of the present invention. The method 100 includes at least the following processes:

1. Process 110 for ion implantation and gate oxide formation;
2. Process 115 for photolithography and ion implantation for threshold adjustment;
3. Process 120 for forming tunneling oxide;
4. Process 125 for gate and oxide-nitride-oxide formation;
5. Process 130 for oxide-nitride-oxide photolithography and threshold adjustment;
6. Process 135 for oxide-nitride-oxide etching;
7. Process 140 for gate and inter-gate oxide formation;
8. Process 145 for polysilicon deposition;
9. Process 150 for control gate photolithography;
10. Process 155 for control gate etching;
11. Process 160 for gate photolithography;
12. Process 165 for gate etching;
13. Process 170 for light doped drain region and lightly doped source region formation;
14. Process 175 for spacer formation;
15. Process 180 for drain and source formation.

The above sequence of processes provides a method according to an embodiment of the present invention. Other alternatives can also be provided where processes are added, one or more processes are removed, or one or more processes are provided in a different sequence without departing from the scope of the claims herein. Future details of the present invention can be found throughout the present specification and more particularly below.

In a specific embodiment, the present method includes provide a semiconductor substrate. The semiconductor substrate is a single crystal silicon wafer in a specific embodiment. Other semiconductor substrates such as silicon on insulator (commonly called SOI), silicon germanium (SiGe) may also be used, depending on the application. Of course there can be other variations, modifications, and alternatives.

FIGS. 2-17 are simplified cross-sectional diagrams illustrating a method for forming a one-time programmable (OTP) device with embedded EEPROM according to an embodiment of the present invention. This diagram is merely an example, which should not unduly limit the scope of the claims. In each of FIGS. 2-17, two regions of the device area are shown simultaneously, i.e., the e-OTP device region and the e-EEPROM device region. A method for simultaneously forming a OTP device and an EEPROM device is discussed below.

At the process 110, an ion implantation is performed and gate oxide is formed. FIG. 2 illustrates a simplified process 110 for ion implantation and gate oxide formation overlying the semiconductor substrate according to an embodiment of the present invention. This diagram is merely an example, which should not unduly limit the scope of the claims. One of ordinary skill in the art would recognize many variations, alternatives, and modifications. As shown in FIG. 2, gate oxide layers 210 and 212 can be formed by an oxide growth process. Gate oxide layer 210 is formed in the OTP region, and gate oxide layer 212 is formed in the EEPROM region. For example, the gate oxide layers 210 and 212 can provide a high breakdown voltage. As another example, the gate oxide layers 210 and 212 have a thickness ranging from 200 Å to 300 Å. As yet another example, the gate oxide layers 210 and 212 overly on a substrate such as a single silicon wafer. In a specific embodiment, an ion implantation process is performed to form diffusion regions 220, 222, and 224. For example, the ion implantation can use implant species such as arsenic in certain embodiments. The implant energy may range from 25 keV to 80 keV, and the implant dose may range from 1E14 to 3E15 per $cm^2$. As another example, the diffusion region 220 is used for electron tunneling during operation of a programmable device, and the diffusion regions 222 and 224 are used for electron tunneling during operation of the EEPROM.

At the process 115, photolithography and ion implantation are performed for adjusting threshold voltage. FIG. 3 is a simplified process 115 for photolithography and ion implantation according to an embodiment of the present invention. This diagram is merely an example, which should not unduly limit the scope of the claims. One of ordinary skill in the art would recognize many variations, alternatives, and modifications. As shown in FIG. 3, a photoresist layer 230 is formed by a photolithography process, and masks the diffusion regions 222 and 224. With the photoresist layer 230, an ion implantation process is performed to form the diffusion regions 240 and 242, which is used to adjust threshold voltages for the programmable device and the EEPROM respectively. For example, the ion implantation process can use B ions or BF ions for a N-channel device. The boron implant energy may range from about 5 keV to about 25 keV, which is equivalent to a $BF_2$ implant energy of about 20 keV to about 100 keV. The implant dose may range from about 5E12 per $cm^2$ to about 1E13 per $cm^2$.

Figures 4, 5:
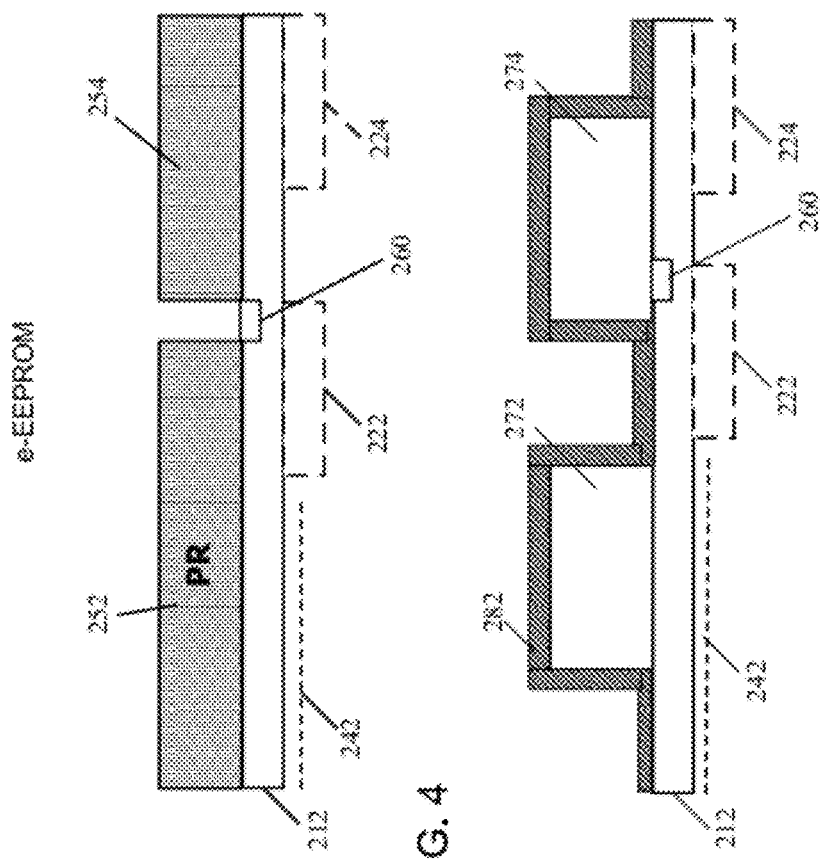
FIG. 4 is a simplified process for tunneling oxide formation according to an embodiment of the present invention.
FIG. 5 is a simplified process for gate and oxide-nitride-oxide formation according to an embodiment of the present invention.

At the process 120, tunneling oxide is formed. FIG. 4 is a simplified process 120 for tunneling oxide formation according to an embodiment of the present invention. This diagram is merely an example, which should not unduly limit the scope of the claims. One of ordinary skill in the art would recognize many variations, alternatives, and modifications. As shown in FIG. 4, photoresist layers 250, 252, and 254 are formed by a photolithography process. A wet etching process is performed to remove a portion of the gate oxide layer 212 that is not covered by the photoresist. Subsequently, a tunneling oxide layer 260 is grown to a thickness, which for example ranges from 50 Å to 150 Å.

At the process 125, gates and oxide-nitride-oxide layers are formed. FIG. 5 is a simplified process 125 for gate and oxide-nitride-oxide formation according to an embodiment of the present invention. This diagram is merely an example, which should not unduly limit the scope of the claims. One of ordinary skill in the art would recognize many variations, alternatives, and modifications. As shown in FIG. 5, gates 270, 272, and a floating gate 274 are formed by a polysilicon deposition and etching process. For example, the thickness of these gates ranges from about 70 nm to about 300 nm. A part of the floating gate 274 is located on the tunneling oxide layer 260. Additionally, a conformal oxide-nitride-oxide (ONO) layers 280 and 282 are formed on the gates 270, 272 and 274, and on the gate oxide layers 210 and 212. In one embodiment, each oxide-nitride-oxide layer includes a first oxide layer, a nitride layer, and a second oxide layer. For example, the first oxide layer, the nitride layer, and the second oxide layer each have a thickness ranging from 30 Å to 150 Å.

Figure 6:
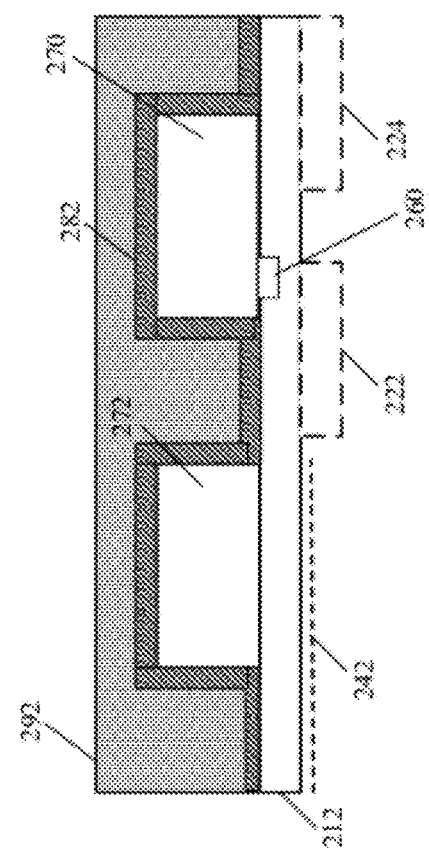
FIG. 6 is a simplified process for oxide-nitride-oxide photolithography and threshold adjustment according to an embodiment of the present invention.
Figure 6:
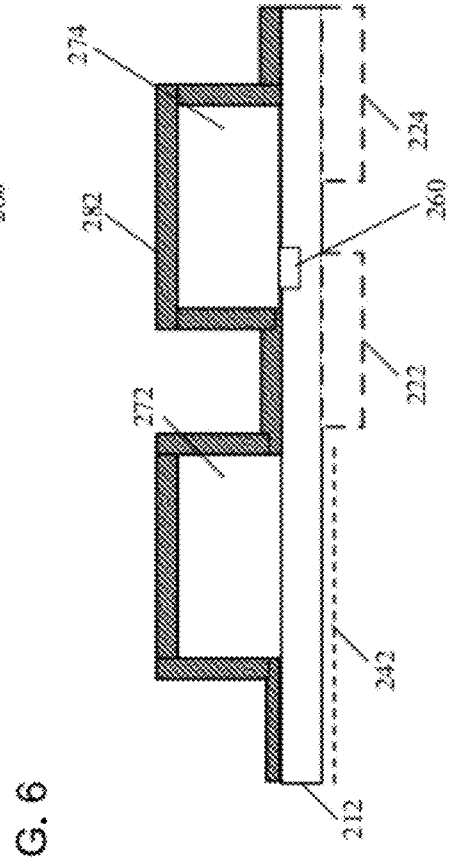

At the process 130, oxide-nitride-oxide photolithography and threshold adjustment is performed. FIG. 6 is a simplified process 130 for oxide-nitride-oxide photolithography and threshold adjustment according to an embodiment of the present invention. This diagram is merely an example, which should not unduly limit the scope of the claims. One of ordinary skill in the art would recognize many variations, alternatives, and modifications. As shown in FIG. 6, photoresist layers 290 and 292 are formed by a photolithography process. In one embodiment, the photoresist layer 290 covers only part of the oxide-nitride-oxide layer 280, but in contrast the photoresist layer 292 covers the entire oxide-nitride-oxide layer 282. An ion implantation process is performed to form a diffusion region 300 under the gate oxide layer 210 and not covered by either the photoresist layer 290 or the floating gate 270. For example, for a N channel device, the ion implantation process can use boron ion species such as B ions, $BF_2$ ions, or In ions. The implant energy may range from about 5 keV to about 100 keV, and the implant dose may range from about 1E12 per $cm^2$ to about 2E14 per $cm^2$.

Figure 7:
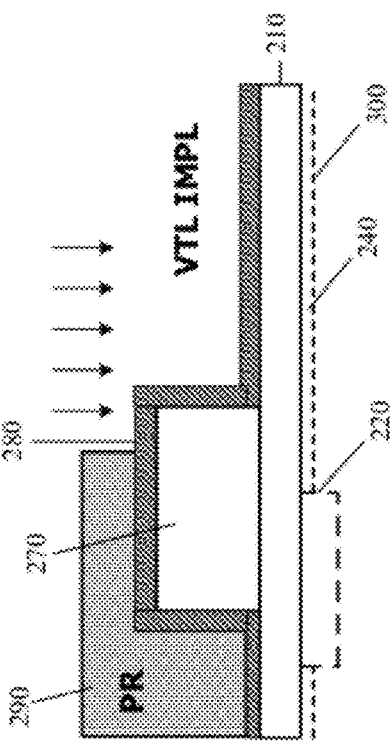
FIG. 7 is a simplified process for etching oxide-nitride-oxide and gate oxide according to an embodiment of the present invention.

At the process 135, oxide-nitride-oxide and gate oxide is etched. FIG. 7 is a simplified process 135 for etching oxide-nitride-oxide and gate oxide according to an embodiment of the present invention. This diagram is merely an example, which should not unduly limit the scope of the claims. One of ordinary skill in the art would recognize many variations, alternatives, and modifications. As shown in FIG. 7, a substantially anisotropic etch is performed in the vertical direction in the OTP device region and removes parts of the oxide-nitride-oxide layer 280 and part of the gate oxide layer 210 that are exposed to the vertical etch. As shown, a first part and a second part of the oxide-nitride-oxide layer 280 is removed, leaving a vertical sidewall of the oxide-nitride-oxide layer 280 on a side of gate 270. Removing the first part of the oxide-nitride-oxide layer 280 exposes a top portion of the gate region 270 near the sidewall 280. Removing the second part of the oxide-nitride-oxide layer 280 exposed an underlying portion of gate oxide layer 210, which is also removed in the etch process.

In FIG. 7, the oxide-nitride-oxide layer 282 and the gate oxide layer 212 in the EEPROM device region are protected by the photoresist layer 292 and thus remain intact. For example, the anisotropic etch uses a dry etching process.

At the process 140, gate and inter-gate oxide is formed. FIG. 8 is a simplified process 140 for growing gate and inter-gate oxide according to an embodiment of the present invention. This diagram is merely an example, which should not unduly limit the scope of the claims. One of ordinary skill in the art would recognize many variations, alternatives, and modifications. As shown in FIG. 8, gate oxide layer 310 and inter-gate oxide layer 320 are grown in areas where the oxide-nitride-oxide layer 280 and the gate oxide layer 210 are removed respectively in the OTP device region at the process 130. The oxide-nitride-oxide layers 280 and 282, respectively prevent selectively regions from oxidation. For example, the gate oxide layer 310 has a thickness ranging from 50 Å to 150 Å, and the inter-gate oxide layer 320 has a thickness ranging from 150 Å to 250 Å. As another embodiment, the inter-gate oxide layer 320 has a thickness substantially equal to 210 Å. In one embodiment, the gate oxide layer 310 is thinner than the gate oxide layer 210, and has a breakdown voltage lower than that of the gate oxide layer 210.

In a specific embodiment, the formation of the inter-gate oxide layer 320 can cause a sharp corner to be formed at a corner of the gate 270. This sharp corner can be used advantageously to lower the voltage required to program the OTP device.

At the process 145, polysilicon is deposited. FIG. 9 is a simplified process 145 for polysilicon deposition according to an embodiment of the present invention. This diagram is merely an example, which should not unduly limit the scope of the claims. One of ordinary skill in the art would recognize many variations, alternatives, and modifications. As shown in FIG. 9, polysilicon layers 330 and 332 are formed by a deposition process. The polysilicon layers 330 and 332 each have a thickness ranging from about 70 nm to about 300 nm.

Figure 10:
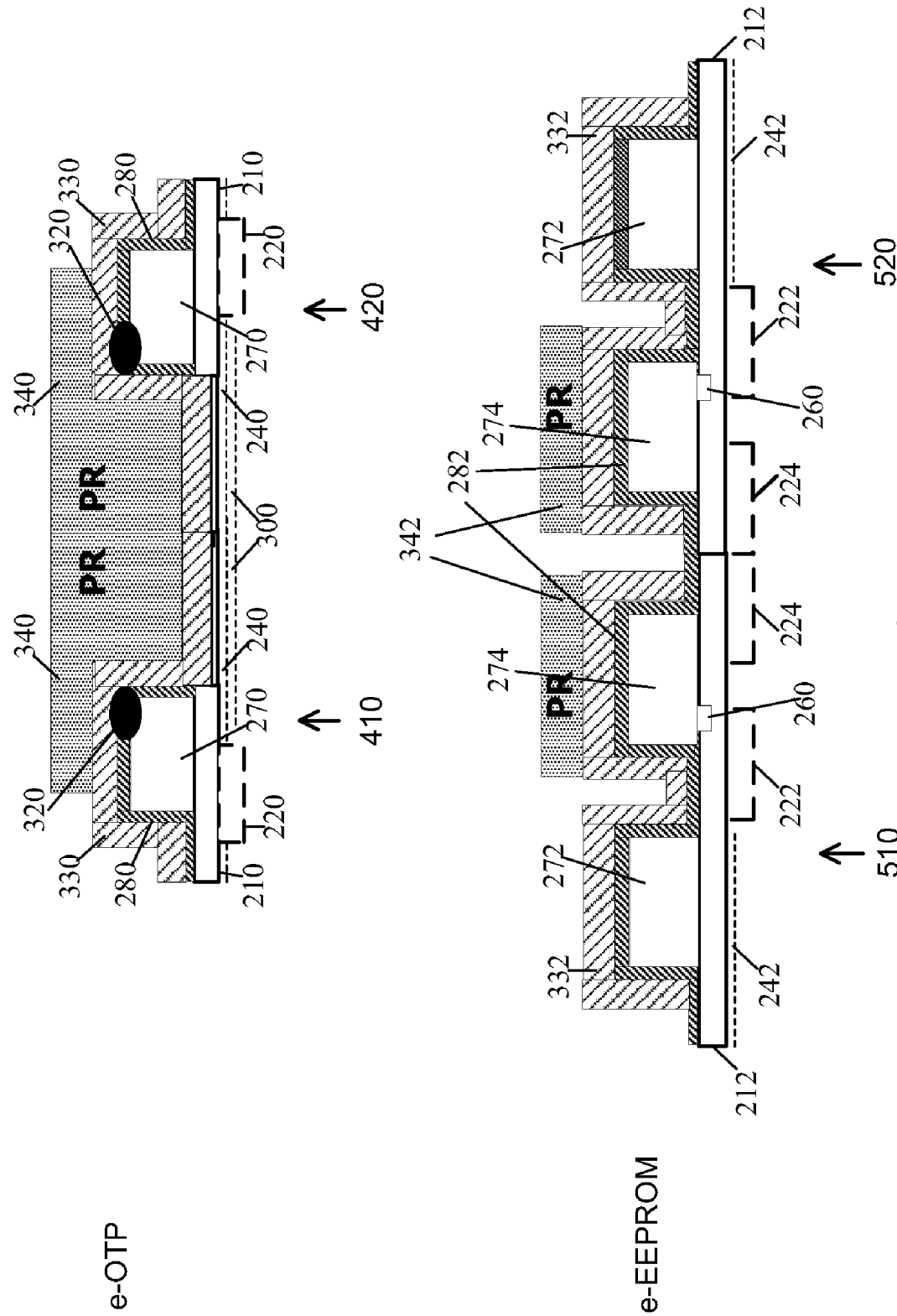
FIG. 10 is a simplified process for control gate photolithography according to an embodiment of the present invention.

At the process 150, the control gate photolithography is performed. FIG. 10 is a simplified process 150 for control gate photolithography according to an embodiment of the present invention. This diagram is merely an example, which should not unduly limit the scope of the claims. One of ordinary skill in the art would recognize many variations, alternatives, and modifications. As shown in FIG. 10, a photolithography process is performed to form photoresist layers 340 and 342 as parts of the structures 410, 420, 510 and 520. The structure 410 corresponds to a structure 400 as shown in FIG. 9, and the structure 420 corresponds to another structure that is the same as the structure 400 but next to the structure 400. The structure 510 corresponds to a structure 500 as shown in FIG. 9, and the structure 520 corresponds to another structure that is the same as the structure 400 but next to the structure 500.

Figure 11:
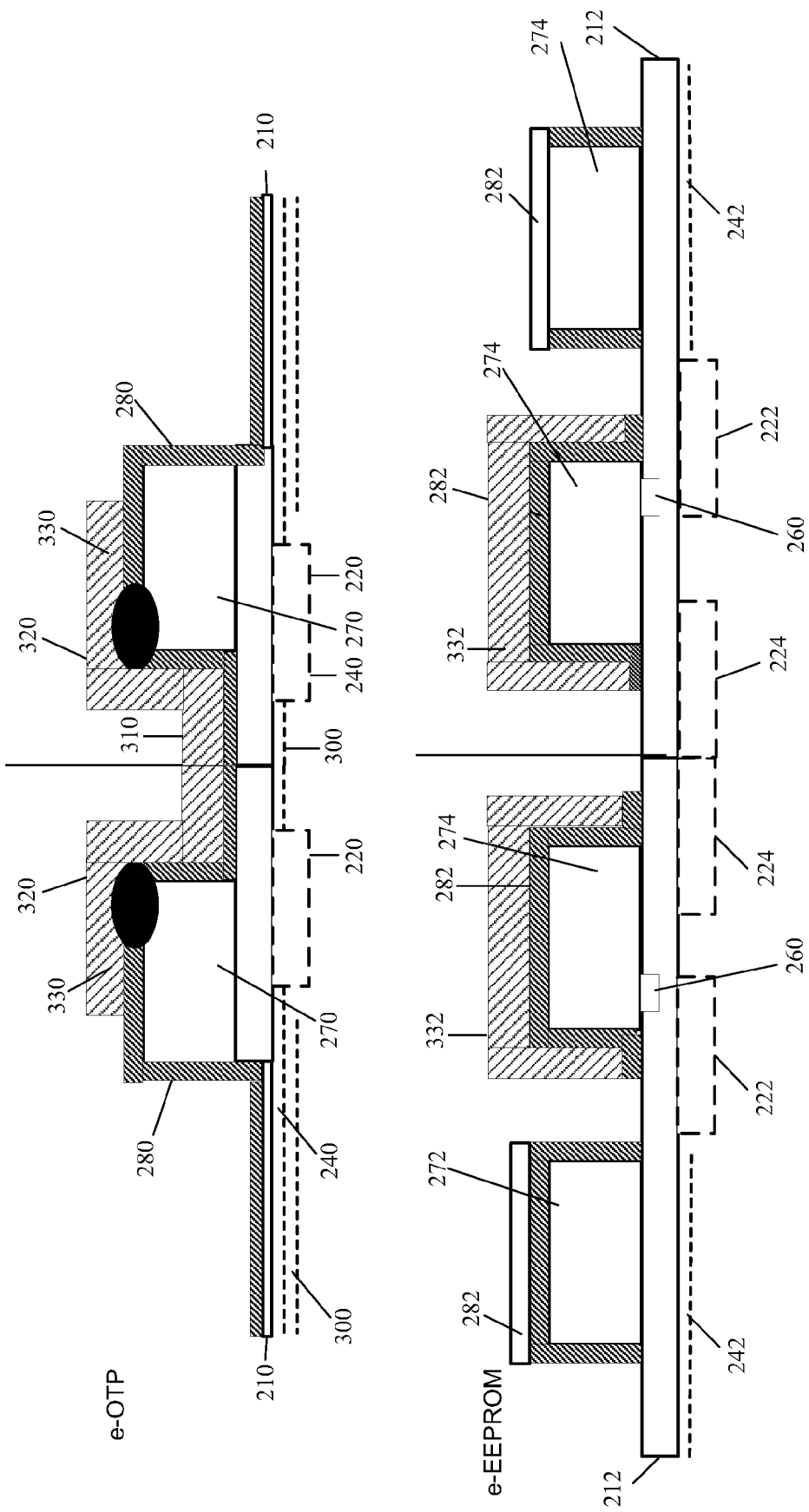
FIG. 11 is a simplified process for control gate etching according to an embodiment of the present invention.

At the process 155, an etching is performed to form control gates. FIG. 11 is a simplified process 155 for control gate etching according to an embodiment of the present invention. This diagram is merely an example, which should not unduly limit the scope of the claims. One of ordinary skill in the art would recognize many variations, alternatives, and modifications. As shown in FIG. 11, an etching process is performed to remove parts of the polysilicon layers 330 and 332 that are not protected by the photoresist layer 340 or 342 or the oxide-nitride-oxide layer 280 or 282. The oxide-nitride-oxide layers 280 and 282 serve as etch stops.

Figure 12:
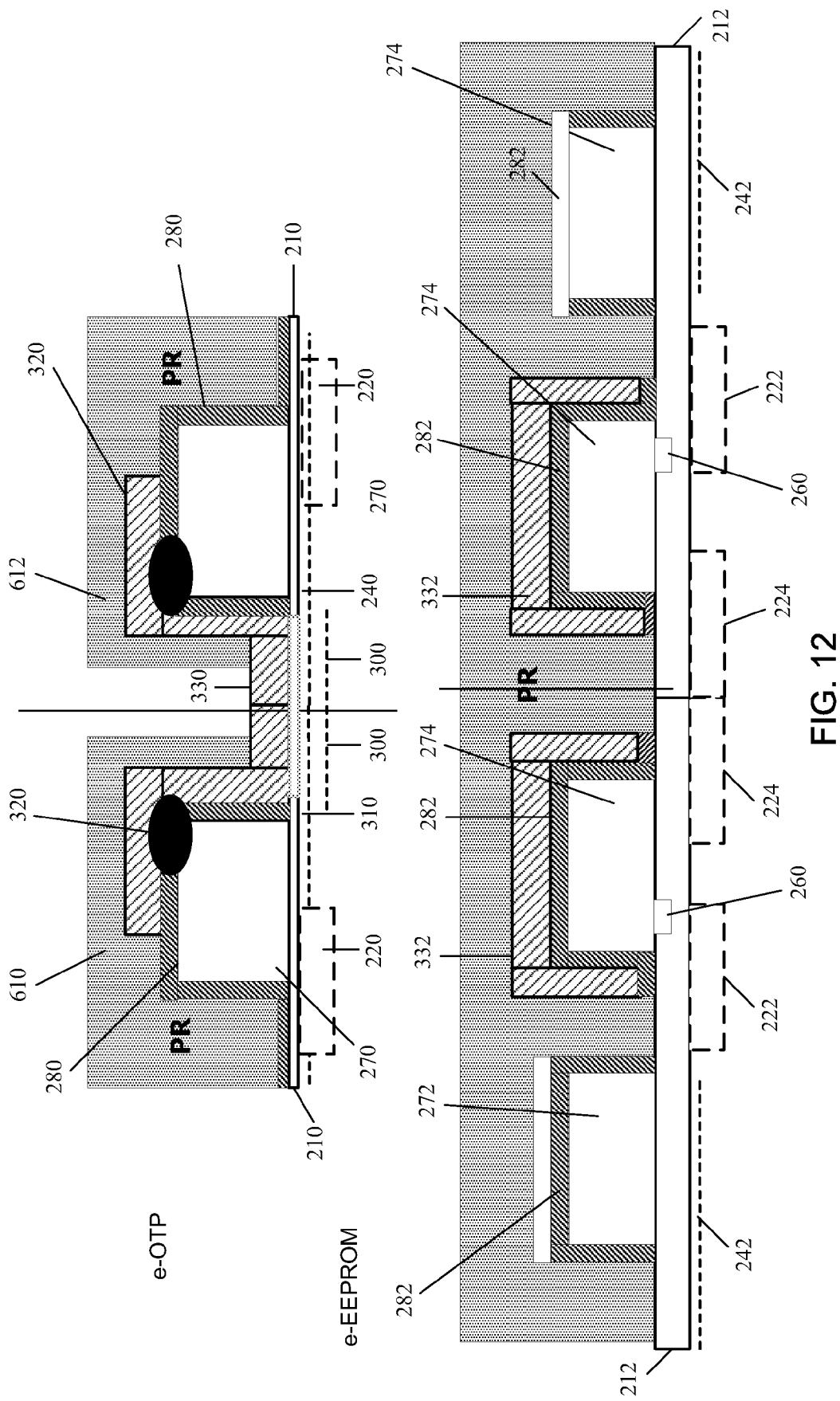
FIG. 12 is a simplified process for gate photolithography according to an embodiment of the present invention.

At the process 160, gate photolithography is performed. FIG. 12 is a simplified process 160 for gate photolithography according to an embodiment of the present invention. This diagram is merely an example, which should not unduly limit the scope of the claims. One of ordinary skill in the art would recognize many variations, alternatives, and modifications. As shown in FIG. 12, resist layers 610, 612, and 614 are formed by a photolithography process. At least portions of the polysilicon layer 330 and the gate oxide layer 320 are not covered by any resist layer.

Figure 13:
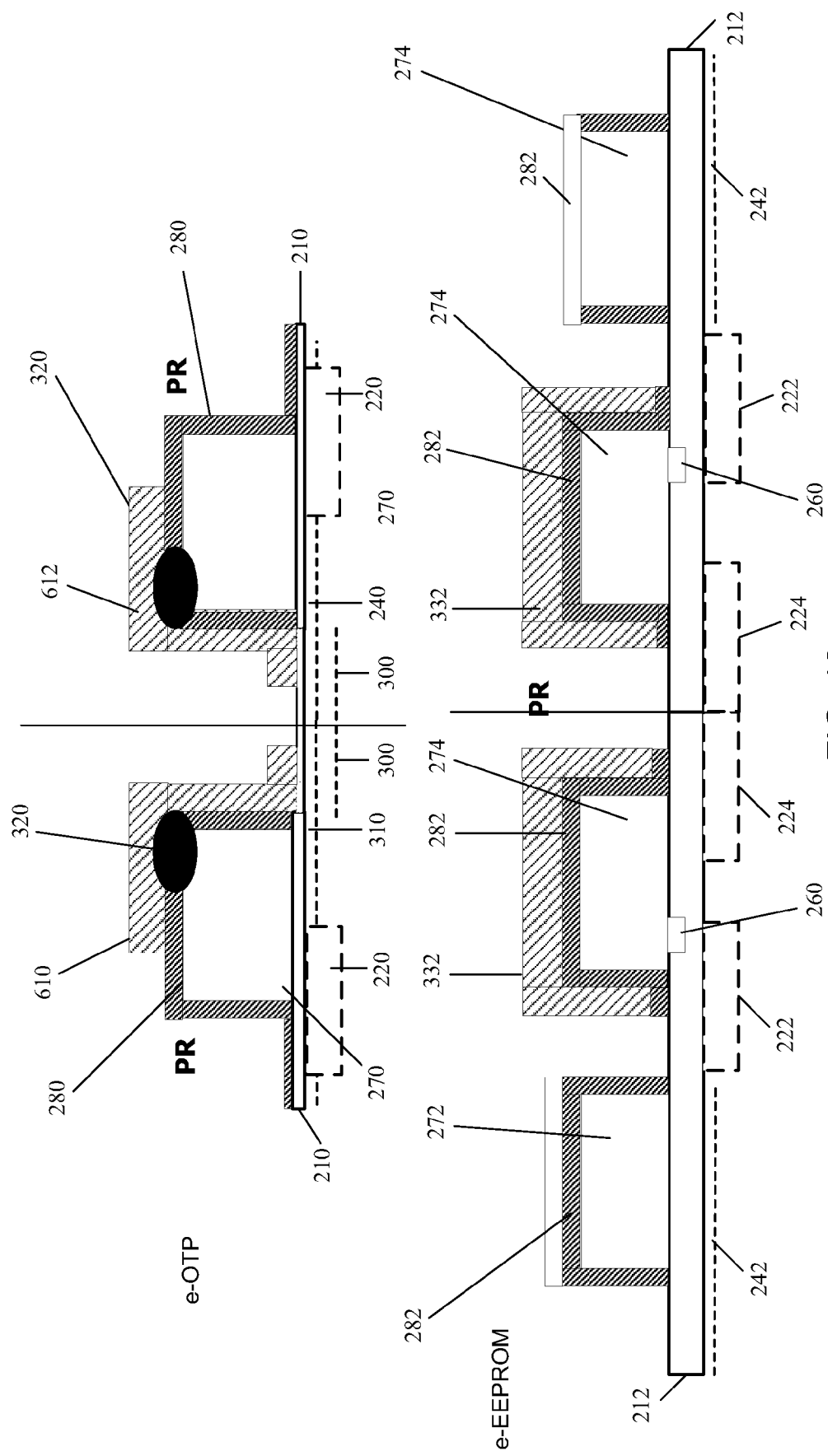
FIG. 13 is a simplified process for gate photolithography according to an embodiment of the present invention.

At the process 165, etching is performed to form gate structures. FIG. 13 is a simplified process 165 for gate photolithography according to an embodiment of the present invention. This diagram is merely an example, which should not unduly limit the scope of the claims. One of ordinary skill in the art would recognize many variations, alternatives, and modifications. As shown in FIG. 13, an etching process is performed to remove parts of the polysilicon layer 330 and the gate oxide layer 310 that are not protected by the photoresist layer 610, 612 or 614, and form gates 620 and 622.

Figure 14:
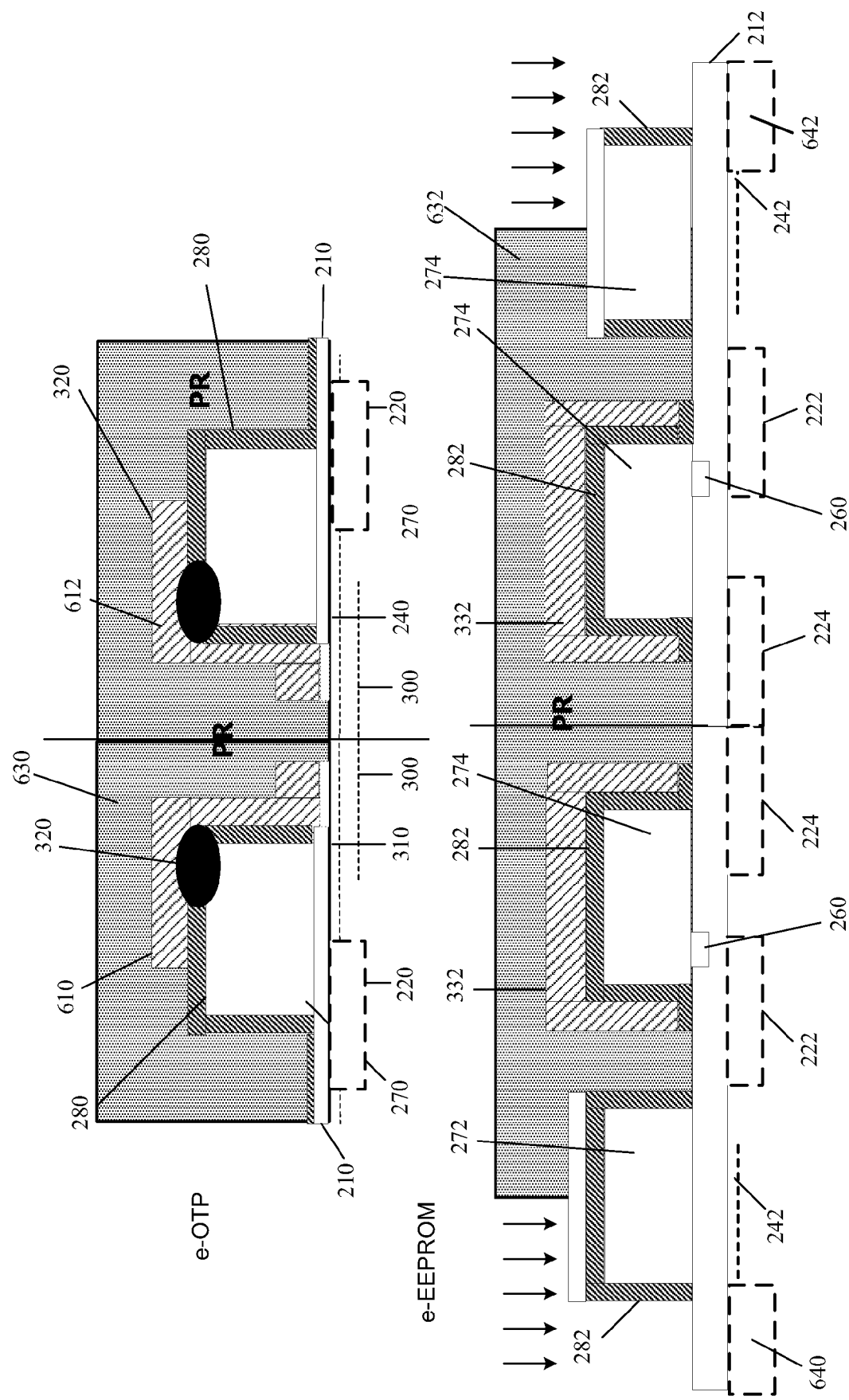
FIG. 14 is a simplified process for photolithography and ion implantation according to an embodiment of the present invention.

At the process 170, photolithography and ion implantation are performed to form lightly doped drain region and lightly doped source region. FIG. 14 is a simplified process 170 for photolithography and ion implantation according to an embodiment of the present invention. This diagram is merely an example, which should not unduly limit the scope of the claims. One of ordinary skill in the art would recognize many variations, alternatives, and modifications. As shown in FIG. 14, resist layers 630 and 632 are formed by a photolithography process. At least portions of the gate oxide layer 212 are not covered by the photoresist layer 630 or 632, the oxide-nitride-oxide layer 282, or the gate 272. Through these portions of the gate oxide layer 212, an ion implantation process is performed to form lightly doped drains 642. In one embodiment, the implantation uses phosphorus ions as implant species. The implant energy may range from about 50 keV to about 100 keV, and the implant dose may range from about 5E13 per $cm^2$ to about 4E14 per $cm^2$.

Figure 15:
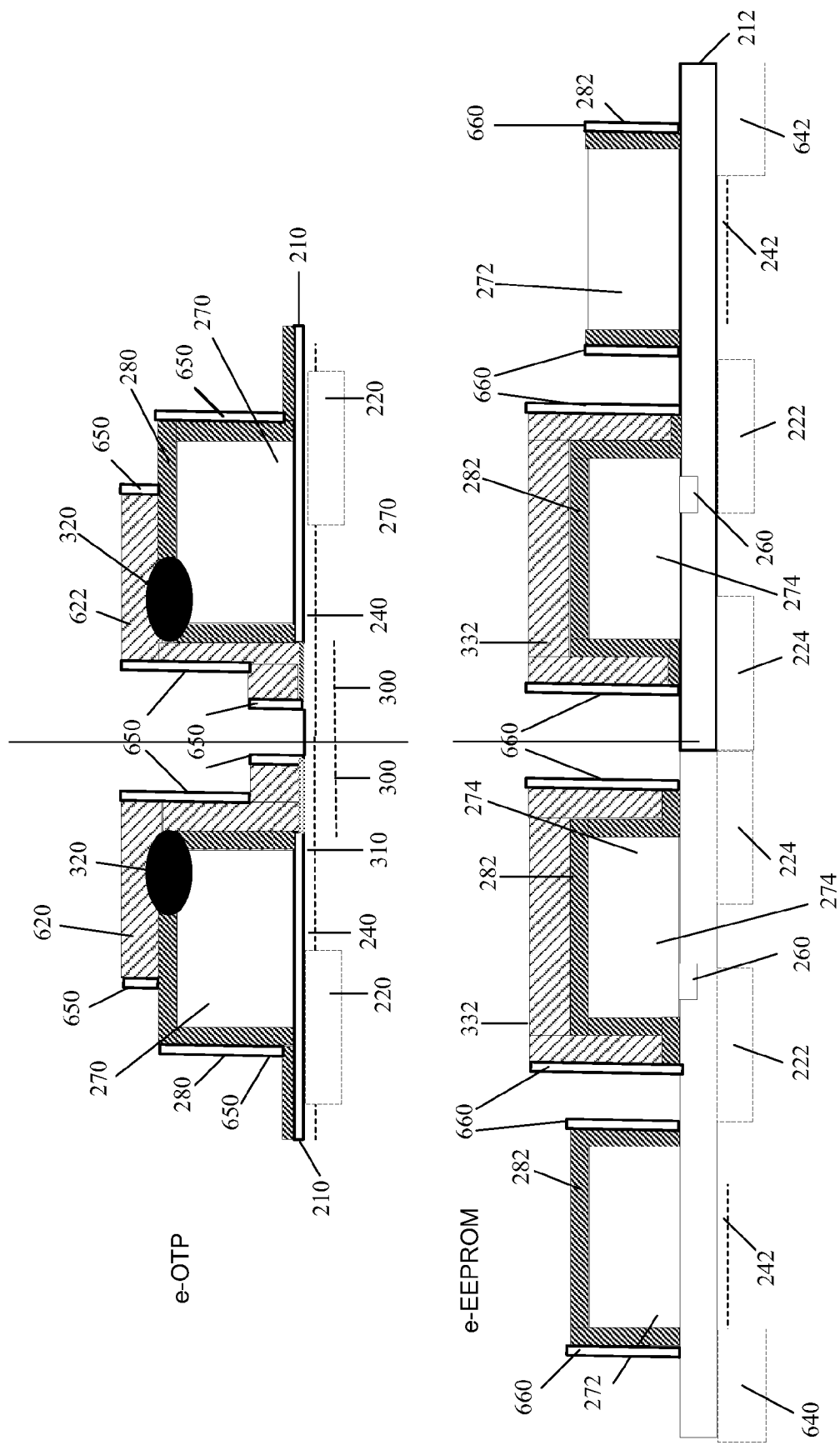
FIG. 15 is a simplified process for spacer formation according to an embodiment of the present invention.

At the process 175, spacers are formed. FIG. 15 is a simplified process 175 for spacer formation according to an embodiment of the present invention. This diagram is merely an example, which should not unduly limit the scope of the claims. One of ordinary skill in the art would recognize many variations, alternatives, and modifications. As shown in FIG. 15, spacers 650 and 660 are formed for gates 270, 272, 274, 620, 622, and 332. For example, the spacers each have a thickness ranging from about 50 nm to about 150 nm. In another example, the spacers can be made of a silicon oxide, silicon nitride, or a silicon oxide on silicon nitride on silicon oxide (commonly called an ONO) composite stack.

Figure 16:
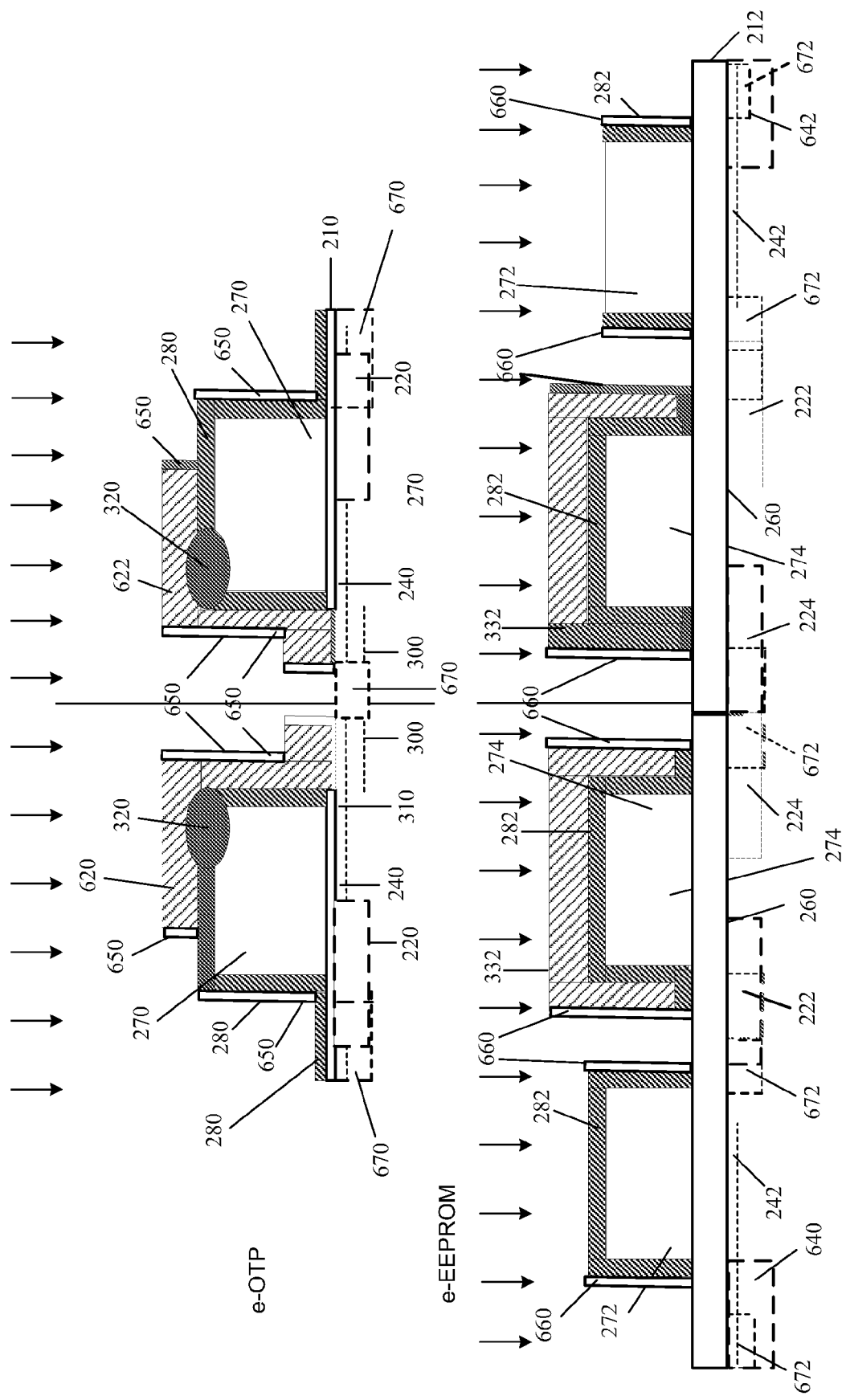
FIG. 16 shows a simplified process for photolithography and ion implantation according to an embodiment of the present invention.

At the process 180, an ion implantation is performed to form heavily doped sources and drains. FIG. 16 shows a simplified process 180 for ion implantation according to an embodiment of the present invention. This diagram is merely an example, which should not unduly limit the scope of the claims. One of ordinary skill in the art would recognize many variations, alternatives, and modifications. As shown in FIG. 16. The ion implantation process is performed to form heavily doped drains and sources 670 and 672. In one embodiment, the implantation uses arsenic ions as implant species. The implant energy may range from about 5 keV to about 70 keV, and the implant dose may range from about 1E15 per $cm^2$ to about 6E15 per $cm^2$.

As discussed above and further emphasized here, FIGS. 1-16 are merely examples, which should not unduly limit the scope of the claims. One of ordinary skill in the art would recognize many variations, alternatives, and modifications. For example, the method includes forming one or more inter-layer dielectric (ILD) layers and performing other back-end-of-line processes after the process 180.

Figure 17:
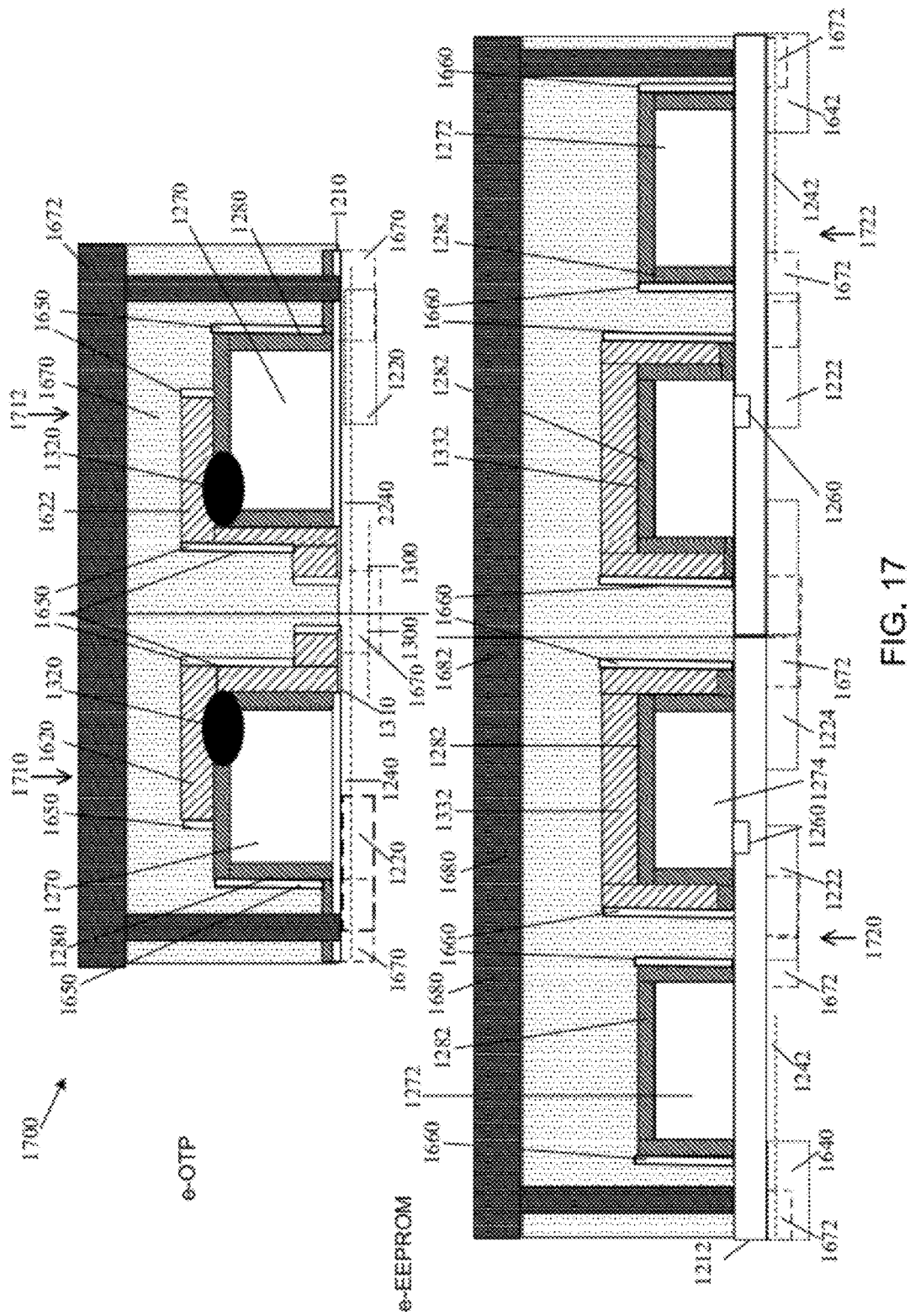
FIG. 17 is a simplified system for electrically programmable devices with embedded EEPROM devices according to an embodiment of the present invention.

FIG. 17 is a simplified system for electrically programmable devices with embedded EEPROM devices according to an embodiment of the present invention. The device 1700 includes the following components:

1. Electrically programmable devices 1710 and 1712;
2. EEPROM devices 1720 and 1722.

The above electronic devices provide components for the system 1700 according to an embodiment of the present invention. Other alternatives can also be provided where certain electrically programmable devices and/or EEPROM devices are added, one or more of devices 1710, 1712, 1720, and 1722 are removed, or one or more devices are arranged with different connections without departing from the scope of the claims herein. In one embodiment, the system 1700 is fabricated with the method 100. In another embodiment, the devices 1710 and 1712 and the devices 1720 and 1722 are on the same silicon wafer.

As shown in FIG. 17, the devices 1710 and 1712 include a gate oxide layer 1210. For example, the gate oxide layer 1210 has a high breakdown voltage. As another example, the gate oxide layer 1210 has a thickness ranging from 200 Å to 300 Å. Additionally, the devices 1710 and 1712 include a diffusion region 1220. For example, the diffusion region 1220 has a dopant concentration ranging from about 1E18 per $cm^3$ to about 1E20 per $cm^3$, and a depth ranging from about 0.2 um about 0.5 um. As another example, the diffusion region 1220 is used for electron tunneling during operation of the programmable devices. Moreover, the devices 1710 and 1712 include a diffusion region 1240, which is used to adjust threshold voltages of the programmable devices. For example, the diffusion region 1240 has a dopant concentration ranging from about 1E16 per $cm^3$ to about 1E18 per $cm^3$, and a depth ranging from about 0.3 um to about 0.6 um.

As shown in FIG. 17, the devices 1710 and 1712 includes gates 1270. For example, the gates 1270 are made of polysilicon. As another example, the thickness for these gates ranges from 70 nm to 300 nm. Additionally, the devices 1710 and 1712 include an oxide-nitride-oxide layer 1280 on at least the gates 1270. In one embodiment, each oxide-nitride-oxide layer 1280 includes a first oxide layer, a nitride layer, and a second oxide layer. For example, the first oxide layer, the nitride layer, and the second oxide layer each have a thickness ranging from 50 Å to 150 Å. Moreover, the devices 1710 and 1712 include a diffusion region 1300 under at least part of the gate oxide layer 1210. For example, the diffusion region 1300 has a dopant concentration ranging from 1E16 per $cm^3$ to 1E18 per $cm^3$, and a depth ranging from about 0.2 um to about 0.7 um. Also, the devices 1710 and 1712 include oxide layers 1310 and 1320. For example, the gate oxide layer 1310 has a thickness ranging from 50 Å to 150 Å, and the inter-gate oxide layer 1320 has a thickness ranging from 150 Å to 250 Å. In one embodiment, the gate oxide layer 1310 is thinner than the gate oxide layer 1210, and has a breakdown voltage lower than that of the gate oxide layer 1210.

As shown in FIG. 17, the devices 1710 and 1712 include gates 1620 and 1622. For example, these gates each can have a thickness ranging from 70 nm to 300 nm. Moreover, the devices 1710 and 1712 include spacers 1650 for gates 1270, 1620 and 1622. For example, the spacers each have a thickness ranging from 50 nm to 150 nm. In another example, the spacers can be made of silicon oxide or silicon nitride or a silicon oxide on silicon nitride on silicon oxide (commonly known as ONO) composite stack. Also, the devices 1710 and 1712 include heavily doped drains and/or sources 1670. For example, the heavily doped drains and/or sources 1670 each can have a dopant concentration ranging from about 1E15 per $cm^3$ to about 6E15 per $cm^3$, and a depth ranging from about 0.1 um to about 0.4 um. In one embodiment, the devices 1710 and 1712 also include other back end of line (BEOL) layers such as inter-layer dielectric (ILD) layer 1670 and metal layer 1672, among others.

As shown in FIG. 17, the devices 1720 and 1722 include a gate oxide layer 1220. For example, the gate oxide layer 1220 has a high breakdown voltage. As another example, the gate oxide layer 1220 has a thickness ranging from 200 Å to 300 Å. Additionally, the devices 1720 and 1722 include diffusion regions 1222 and 1224. For example, the diffusion regions 1222 and 1224 each have a dopant concentration ranging from about 1E18 per $cm^3$ to about 1E18 per $cm^3$, and a depth ranging from about 0.2 um to about 0.8 um. As another example, the diffusion regions 1222 and 1224 are used for electron tunneling during operation of the EEPROM devices. Moreover, the devices 1720 and 1722 include a diffusion region 1242, which is used to adjust threshold voltages for the EEPROM devices. For example, the diffusion region 1242 has a dopant concentration ranging from about 5E15 per $cm^3$ to about 2E16 per $cm^3$, and a depth ranging from 0.3 um to 0.8 um. Also, the devices 1720 and 1722 include a tunneling oxide layer 1260. For example, the tunneling oxide layer 1260 has a thickness ranging from 50 Å to 150 Å.

As shown in FIG. 17, the devices 1720 and 1722 each include gates 1272 and 1274. For example, the gates 1272 and 1274 are made of polysilicon. As another example, the thickness for these gates ranges from 70 nm to 300 nm. In yet another example, a part of the floating gate 1274 is located on the tunneling oxide layer 260. Additionally, the devices 1720 and 1722 include an oxide-nitride-oxide stack 1282 on at least the gates 1272 and 1274. In one embodiment, each oxide-nitride-oxide stack 1282 includes a first oxide layer, a nitride layer, and a second oxide layer. For example, the first oxide layer, the nitride layer, and the second oxide layer can each have a thickness ranging from 50 Å to 150 Å.

As shown in FIG. 17, the devices 1720 and 1722 include control gates 1332. Additionally, the devices 1720 and 1722 include lightly doped drain regions 1642. For example, the lightly doped drain regions each can have a dopant concentration ranging from about 1E18 per $cm^3$ to about to about 1E18 per $cm^3$, and a thickness ranging from about 0.2 um to about 0.6 um. Moreover, the devices 1720 and 1722 include spacers 1660 for gates 1272, 1274, and 1332. For example, the spacers each have a thickness ranging from 50 nm to 150 nm. In another example, the spacers can be made of silicon oxide or silicon nitride or an ONO (silicon oxide on silicon nitride on silicon oxide) stack. Also, the devices 1720 and 1722 include heavily doped drains and/or sources 1672. For example, the heavily doped drains and/or sources 1672 each can have a dopant concentration ranging from about 1E15 per $cm^3$ to about 6E15 per $cm^3$, and a depth ranging from 0.1 um to 0.4 um. In one embodiment, the devices 1720 and 1722 also include convention back end of line (BEOL) layers such as an inter-layer dielectric layer 1680 and metal layer 1682.

As discussed above and further emphasized here, FIG. 17 is merely an example, which should not unduly limit the scope of the claims. One of ordinary skill in the art would recognize many variations, alternatives, and modifications. For example, the devices 1710 and 1712 are used as one-time programmable (OTP) devices, whereas devices 1720 and 1722 are EEPROM devices. In an embodiment, one-time programmable (OTP) device 1710 includes a first gate oxide layer 1210 and a second gate oxide layer 1310, the second gate oxide layer 1310 being thinner than the first gate oxide layer 1210. It also has a first gate 1270 on the first gate oxide layer 1210 and a first dielectric layer 1280 on the first gate. OPT device 1710 also has an inter-gate oxide layer 1320 on the first gate 1270. Additionally, a second gate 1620 overlying the first dielectric layer 1280, the inter-gate oxide layer 1320, and the second gate oxide layer 1310. In a specific embodiment, the inter-gate oxide layer 1320 is adapted to shape a corner region of the second gate 1620 for programming the OTP device. In an embodiment, EEPROM devices 1720 and 1722 each includes a tunnel oxide region for program and erase of the EEPROM devices.

In one embodiment, these OTP devices cannot be erased by ultra-violet radiation, but can be erased by X-rays. As another example, the devices 1710 and 1712 include a quartz window in the package and used as erasable programmable read only memory (EPROM) devices. In one embodiment, the EPROM devices can be erased by ultra-violet radiation.

Figure 18:
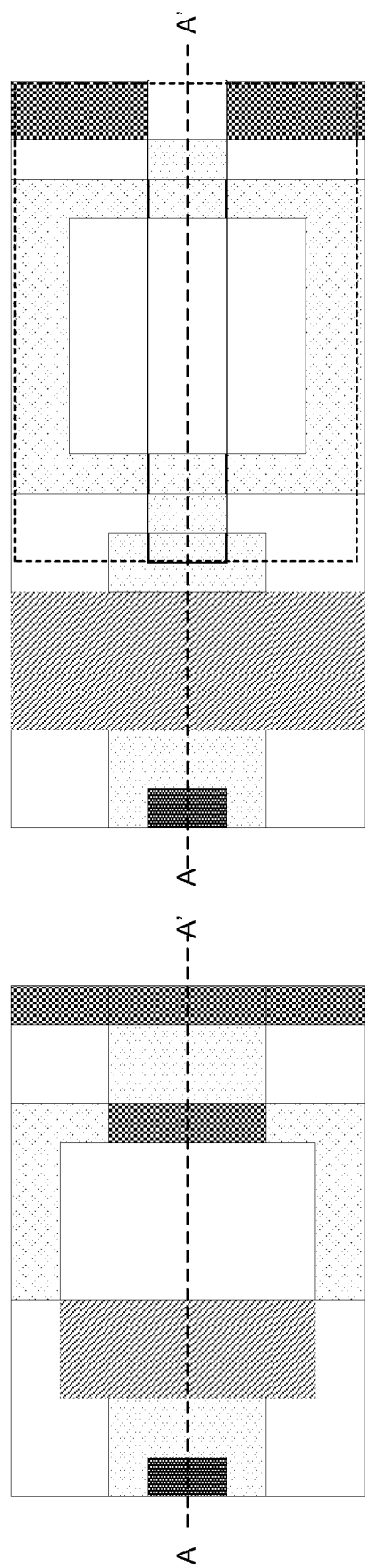
FIG. 18 is a simplified top view for electrically programmable devices with embedded EEPROM devices according to an embodiment of the present invention.

FIG. 18 is a simplified top view for electrically programmable devices with embedded EEPROM devices according to an embodiment of the present invention. This diagram is merely an example, which should not unduly limit the scope of the claims. One of ordinary skill in the art would recognize many variations, alternatives, and modifications. As shown, FIG. 18 is a cross sectional view along AA' in FIG. 17.

It is also understood that the examples and embodiments described herein are for illustrative purposes only and that various modifications or changes in light thereof will be suggested to persons skilled in the art and are to be included within the spirit and purview of this application and scope of the appended claims.

What is claimed is:

1. A semiconductor device with an embedded EEPROM device, the semiconductor device comprising:
    a one-time programmable device on a silicon wafer; and
    an electrically erasable programmable device on the silicon wafer, wherein the one-time programmable device includes:
        a first gate oxide layer and a second gate oxide layer, the second gate oxide layer being thinner than the first gate oxide layer;
        a first gate on the first gate oxide layer;
        a first dielectric layer on the first gate;
        an inter-gate oxide layer on the first gate, the inter-gate oxide adapted to shape the first gate for programming the one-time programmable device; and
        a second gate on the first dielectric layer, the inter-gate oxide layer, and the second gate oxide layer;
    wherein the electrically erasable programmable device includes a tunnel oxide.

2. The device of claim 1 wherein the first dielectric layer comprises a first silicon oxide sub-layer, a silicon nitride sub-layer, and a second silicon oxide sub-layer.

3. The device of claim 1 wherein the inter-gate oxide layer is associated with a thickness ranging from 150 Å to 250 Å.

4. The semiconductor device of claim 1, wherein the first gate comprises a sharp corner adjacent the inter-gate oxide layer.

5. The semiconductor device of claim 1, wherein the first gate comprises a sharp corner adjacent the inter-gate oxide layer.

6. The semiconductor device of claim 1, wherein the third gate is a floating gate.

7. A semiconductor device, comprising:
    a substrate including a first device region and a second device region;
    a first gate oxide layer in the first device region and the second device region;
    a first gate in the first device region;
    a second gate and a third gate in the second device region;
    a first dielectric layer, a first portion of the first dielectric layer being disposed over the first gate, a second portion of the first dielectric layer being disposed adjacent a sidewall of the first gate, and a third portion of the first dielectric layer being disposed over the third gate;
    an inter-gate oxide layer on the first gate and being disposed between the first portion and the second portion of the first dielectric layer;
    a second gate oxide layer in the first device region, the second gate oxide layer being on a portion of the substrate not covered by the first gate;
    a fourth gate overlying the second gate oxide layer, the inter-gate oxide layer, and the first portion and the second portion of the first dielectric layer in the first device region; and
    a fifth gate overlying the third portion of the first dielectric layer which is disposed over the third gate in the second device region.

8. The semiconductor device of claim 7, wherein the first gate comprises a sharp corner adjacent the inter-gate oxide layer.

9. The semiconductor device of claim 7, wherein first dielectric layer comprises an oxide-nitride-oxide layer.

10. The semiconductor device of claim 7, wherein the inter-gate oxide layer comprises thermal oxide.

11. The semiconductor device of claim 7, comprising a one-time programmable device that includes the first gate and the second gate.

12. The semiconductor device of claim 7, further comprising a tunnel oxide between the third gate and the substrate.

13. The semiconductor device of claim 7, wherein the third gate is a floating gate.

14. The semiconductor device of claim 7, wherein a first portion of the first gate oxide layer is disposed between the first gate and the substrate in the first device region.

15. The semiconductor device of claim 7, wherein a third portion of the first gate oxide layer is disposed between the third gate and the substrate in the second device region.

16. The semiconductor device of claim 7, wherein a second portion of the first gate oxide layer is disposed between the second gate and the substrate in the second device region.

17. The semiconductor device of claim 7, comprising an electrically erasable programmable device that includes the second gate, the third gate, and the fifth gate.

* * * * *